United States Patent [19]

Preston et al.

[11] Patent Number: 4,557,807
[45] Date of Patent: Dec. 10, 1985

[54] STATIC FREE MOLDED PLASTIC PARTS

[75] Inventors: Joseph R. Preston, Radnor; Louis J. Hillenbrand, Columbus, both of Ohio

[73] Assignee: Battelle Development Corporation, Columbus, Ohio

[21] Appl. No.: 691,106

[22] Filed: Jan. 11, 1985

[51] Int. Cl.⁴ .................. C25D 1/00; C25D 1/20
[52] U.S. Cl. .................................. 204/4; 204/9; 204/58.5
[58] Field of Search ............ 204/3, 4, 6, 9, 58.5

[56] References Cited

U.S. PATENT DOCUMENTS

| | | | |
|---|---|---|---|
| 3,441,487 | 4/1969 | Rea | 204/4 |
| 3,686,079 | 8/1972 | Masunaga | 204/58.5 |
| 3,689,729 | 9/1972 | Neward | 204/3 |
| 3,759,797 | 9/1973 | Masunaga | 204/58.5 |
| 3,954,462 | 5/1976 | Levinos | 204/6 |

Primary Examiner—T. M. Tufariello
Attorney, Agent, or Firm—Benjamin Mieliulis

[57] ABSTRACT

A novel in-mold electrodeposition process is disclosed for the production of plastic parts having conductive polymeric coatings such as polypyrroles or polythiophenes. Parts produced according to the novel disclosed in-mold electrodeposition process would have wide applicability including static free plastic parts shielding devices and circuits. The disclosed process advances the art by enabling the utilization of conductive polymers many of which were heretofore considered too brittle for commercial adaptation.

10 Claims, 5 Drawing Figures

STATIC FREE MOLDED PLASTIC PARTS

BACKGROUND OF THE INVENTION

1. Field of the Invention

This invention relates to polymeric conductive films and to plastic solids and to electrochemical methods for forming such conductive polymers as films on plastic parts. This invention relates to in-mold coating techniques. More specifically it relates to a novel in-mold electrodeposition process which enables the deposition of conductive polymers as films on a catalyst-treated mold surface and the subsequent in-mold transfer of said film to a molded part to yield, for example, static free molded plastic parts.

2. Description of Prior Art

Various conductive polymeric organic solids are known such as for example, polyacetylene doped with As or Sb flourides or other rare earth salts; poly-p-phenylene doped with $I_2$; polythiophene; and polypyrrole.

Bargon, J., Mohmond, S., and Waltman, R. J., IBM J. Res. Develop., 27, No. 4, 330–41 (1983) describes the electrochemical synthesis of a variety of electrically conducting polymers from aromatic compounds.

Soga, K., et al., Synthetic Materials, 6 275–83 (1983) describes moderately conductive, predominantly globular, polymers prepared by dehydrohalogenation of PVC.

Yoshino, K., et al., Japanese J. Applied Physics, 22, No. 6 L 376–78 (1983) describes enhanced conductivity for polyacetylene systems by electron beam irradiation in the presence of dopants, such as $SF_6$ and $C_2H_2$.

Electrochemical methods have been used to generate conducting organic polymers as free standing films. In particular, electropolymerization of pyrrole, N-substituted pyrrole derivatives, thiophene and substituted thiophene has been reported. These free standing thin films, while interesting, have not been widely used due to their fragility inherent in their thinness. The present invention advances the state of the art by providing a rapid method for providing practical plastic substrates coated with these conductive polymers thus making these polymers commercially useful.

The electrical conductivity of polymeric conductive organic solids and films it is believed can vary from semiconductor to metallic conductivities. These conductive polymeric solids if formed as films of conductive coatings onto plastic parts can yield static free plastic parts. The present invention could be used to form a conductive layer on molded plastic parts to dissipate static buildup to thus minimize the risk of sparks anywhere near explosive gases or mixtures. Moreover, to the extent conductivity of the conductive organic film can be controlled, further applications could include batteries, p-n junctions, EMI shields, photoconductors, chemical sensors, microwave absorbers, superconductors, circuits, and a variety of switches. Many of these applications could be realized by a successful electrodeposited in-mold coating production process to manufacture plastic parts having conductive or semi-conductive polymeric coatings. Such an electrodeposited in-mold coating process is disclosed by the present invention.

SUMMARY OF THE INVENTION

An object of the present invention is to enable the rapid molding of static free plastic parts, more particularly, plastic parts having a conductive or semi-conductive coating formed in the mold by electrodeposition.

Another object of the present invention is to disclose monomers useful for forming conductive or semi-conductive polymeric films as coatings for plastic parts according to the electrodeposition and in-mold techniques of the present invention.

Another object of this invention is to disclose the technology for in-mold electrodeposition of conductive polymeric coatings onto a mold surface thereby enabling formation of plastic parts having a conductive coating or semi-conductive coating useful in such diverse applications as color-switching coatings, memory devices, battery components, EMI shields, microwave absorbers, electrical circuits or photoconductors.

The present invention teaches a method for the production of static free plastic parts comprising plastic parts which have on their surface a coating or film of conductive or semi-conductive polymeric material. Said film of conductive or semi-conductive polymeric material is electrodeposited on the platinum-treated surface of a mold cavity. The platinum or other catalyst deposited, impregnated, or plated onto the surface of the mold cavity facilitates the polymerization and electrodeposition of a conductive or semi-conductive polymeric film. Following mold surface coating with the electrodeposited conductive or semi-conductive polymeric film, a viscoelastic molding material such as any typical molten plastic or curable plastic is injected or compressed into the mold to form a plastic part coated or melt-fused with the conductive or semi-conductive polymeric film, yielding upon mold release a coated plastic part. The finished plastic part has a conductive or semi-conductive polymeric film coating.

Pyrrole and thiophene monomers and their derivatives have been recognized as yielding free standing conductive or semi-conductive polymeric films on platinum electrodes, thus are particularly useful in the practice of the present invention.

Pyrrole and/or thiophene monomers and their derivatives in this invention are polymerized onto a platinum plated mold cavity serving as an electrode. Said monomers polymerize as a film of usually less than 100 nm thickness. The polymerized film has a higher affinity for the molten plastic used to produce the plastic part than the affinity for the platinum mold surface. Thus, the polymeric film adheres to or is melt fused with the molten plastic part and upon solidification and mold release the polymeric film releases from the mold cavity surface. The result is a plastic part having a coating of a conductive or semi-conductive polymeric film.

Conductive, since it is a relative term, as used throughout this invention is understood to include the range of conductivities from and inclusive of semi-conductive through metallic conductivities.

DETAILED DESCRIPTION

This invention is directed to a process in which plastic parts or articles are given an electrodeposited coating of a polymeric organic conductive or semi-conductive polymeric film by first rapidly electrodepositing said film on all or portions of the molding surfaces of a mold and then molding a plastic article in the mold so as to transfer the polymeric conductive film from the mold to the surface of the plastic article.

Figure 1:
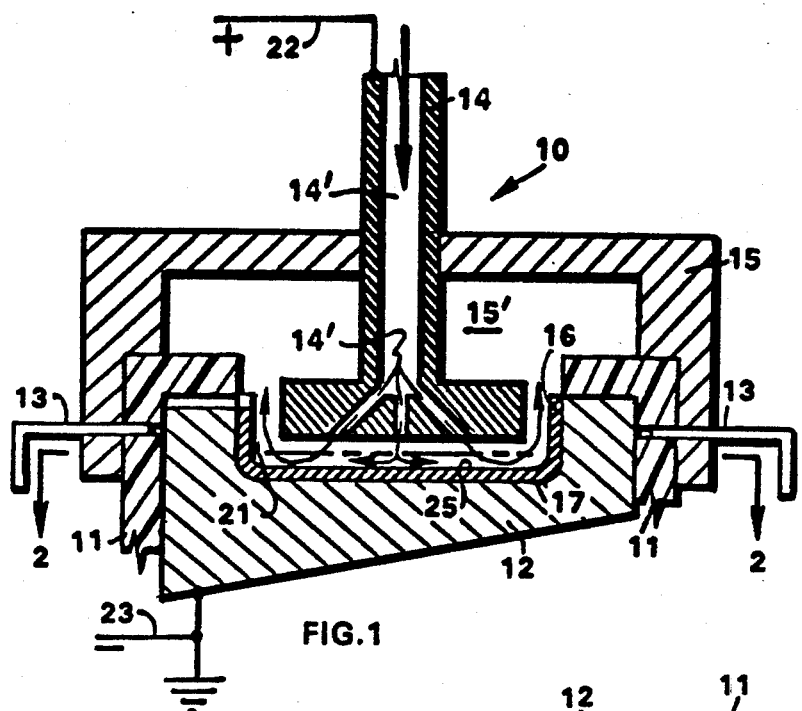
FIG. 1 is a front sectional view of the electrodeposition apparatus positioned over a mold member used for coating and molding in the present invention.

In FIG. 1, which illustrates a typical arrangement for electrodepositing a polymeric semi-conductive or conductive film onto a member of a mold, an electrodeposition apparatus 10 is mounted over a mask 11 and a mold member 12. The electrodeposition apparatus 10 is held in place over the mold member 12 by means of alignment pins 13. The electrodeposition apparatus 10 comprises an electrode 14 with interior channels 14' through which flows an electrocoating solution, an alignment fixture 15 to hold the electrode 14 in position over the mold member 12, and the electrical conductors 22 and 23 by means of which the electrode 14 and the mold member 12 are connected to a source of positive and negative electrical potential (not shown). Mold surface 17 is platinum plated to provide a catalytic deposition site for the polymeric film. Depending on the intended application, the platinum plating can be masked to provide a patterned or decorative site for polymeric film deposition. A polymeric conductive or semi-conductive film 16 is deposited on the mold surface 17 of the mold member 12 by the application of a potential difference between the electrode 14 and mold member 12 (typically grounded at 23) while simultaneously turbulently flowing an electrocoating solution between the electrode 14 and the mold member 12.

Figure 2:
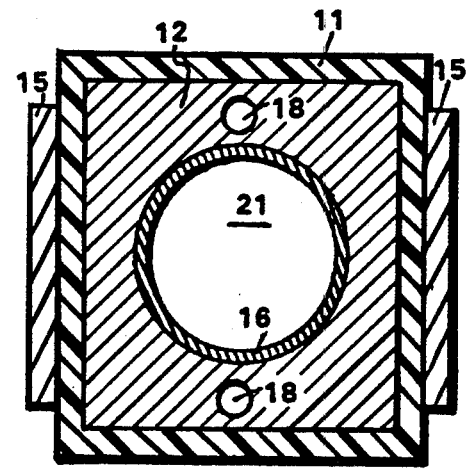
FIG. 2 is a top sectional view of a portion of the electrodeposition apparatus and the mold member of FIG. 1 taken in the plane 2—2 of FIG. 1.

FIG. 2 helps to illustrate the general shape of the mold member cavity 21 and the position of the alignment fixture 15. The alignment fixture 15 is positioned over the mold 12 so as to form a space 15' (FIG. 1) that is open at both ends to allow the electrocoating solution to flow from the electrodeposition apparatus 10 after the electrocoating solution has been pumped through the electrode channels 14' and caused to turbulently flow between the electrode 14 and the mold surface 17.

Figure 3:
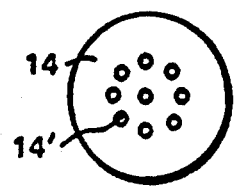
FIG. 3 is an end view of the electrode shown in FIG. 1.

FIG. 3 illustrates a typical arrangement of the lower ends of the internal channels 14' in the electrode 14. Such an arrangement allows a turbulent flow of electrocoating solution to be maintained over all parts of the mold surface 17 on which the polymeric conductive or semi-conductive film is being electrodeposited. As seen in FIG. 1 and FIG. 3, the shape of the electrode 14 should generally conform to the general shape of the mold surface 17. The electrode 14 typically comprises alloys of lead with tin or antimony, platinum, platinized titanium, or the like. Deposition onto mold surface 17 of mold member 12 is preferred. Polarity of electrical conductors 22 and 23 is readily selected to achieve such result depending on whether anodic or cathodic polymers are being electrodeposited. Pyrroles for example polymerize upon being oxidized. Mold member 12 should be selected to be the site where such oxidation occurs.

Although this invention is illustrated with a single electrode 14 which contains interior channels 14' to obtain turbulent electrocoating solution flow in the electrodeposition step, multiple electrodes and other means for achieving turbulent flow such as stirring, use of nozzles, and the like may be used. The number, arrangement, and shape of the electrodes and means to achieve turbulent flow largely depend on the shape and size of the article upon which the polymeric film is to be electrodeposited.

Figure 4:
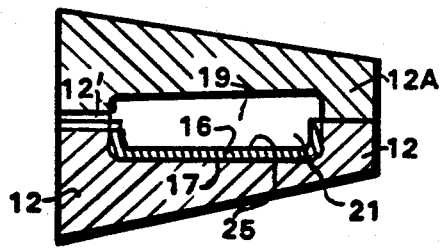
FIG. 4 is a front sectional view of the mold member of FIG. 1 having an electrodeposited coating assembled with a second unplated mold member so as to form a mold cavity.

FIG. 2 illustrates two alignment holes 18 which are used in conjunction with the alignment pins on a second mold member 12A so as to align the two mold members 12 and 12A when they are fitted together to form a mold cavity 19 as shown in FIG. 4. Molding material can be poured, injected, inserted as preforms, or otherwise caused to enter the mold cavity 19 through the inlet port or opening 12'. FIG. 4 illustrates a mold arrangement wherein only one side and half an edge of a plastic article 26 will be coated with an electrodeposited conductive or semi-conductive polymeric film. When the upper part of the article 26 is to be coated also, the upper mold member 12A may be provided with an electrodeposited polymeric film similar to the polymeric conductive or semi-conductive film 16 on the lower mold member 12. Other variations and patterns may be obtained by selectively masking various portions of the mold members 12 and 12A.

Figure 5:
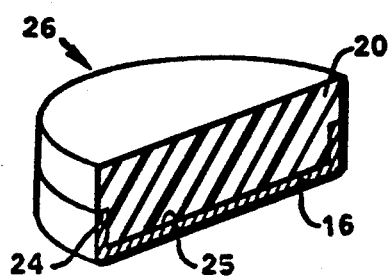
FIG. 5 is a perspective sectional view of a plastic article after it has been molded and removed from the apparatus shown in FIG. 4.

FIG. 5 illustrates the polymeric film coated plastic article 26 after it has been removed from the mold illustrated in FIG. 4. FIG. 5 illustrates the selective electrodeposition film coating of half of the plastic article 26 achieved by electrodepositing a polymeric conductive or semi-conductive film on only one mold member 12 and also illustrates the surface at the junction 24 of the plastic body 20 and the polymeric conductive or semi-conductive film 16.

Rapid electrodeposition onto the mold surface 17 is carried out using high current densities and a turbulent flow of electrocoating solution between the electrode 14 and the mold surface 17.

In the practice of this invention a conductive film is electrodeposited onto the platinum catalyst coated mold cavity surface followed by injection of a plastic to be molded. Indium tin oxide can be used as a catalyst in place of platinum. The earlier electrodeposited conductive film has a higher affinity for the injected molding polymer due to similarity than for the mold cavity wall. Films such as the thiophenes and pyrroles typically slough off the catalytic platinum electrode mold surface when formed thus these films would better adhere to an injected molding polymer than to the mold cavity wall. Melt fusing can enhance bonding.

Examples of monomers useful in this invention for forming conductive coatings by electrodeposition onto a catalytic-coated, preferably platinum, mold surface include thiophene and its derivatives, especially the B-substituted thiophenes yielding polythiophene films and B-substituted polythiophene films. Specific examples of useful thiophenes include thiophene, 2,2'-bithiophene, 3-methylthiophene, 3-bromothiophene, 3-thiophene acetonitrile, and 3,4 dibromothiophene.

Additional monomers useful for forming conductive coatings by electrodeposition onto a catalytic mold surface include pyrrole and its derivatives, especially N-substituted pyrrole derivatives such as N-alkyl pyrrole derivatives and B-substituted pyrroles such as 3-methylpyrrole also B,B'-dimethylpyrrole. Many of the above monomers are typically fluid at room temperature. To adjust viscosity, any common solvent solubilizing the monomer can be optionally included.

Other useful electrodepositable conductive coatings would include polyacetylene doped with common dopants such as As or Sb fluoride or other rare earth salts, also doped aromatic compounds and dehydrohalogenated PVC and polythienylene. Other useful dopants can include $AsF_6^-$, $ClO_4^-$, $CF_3SO_3^-$, iodine salts and $C_2H_2$.

Following formation of the conductive film, a molding polymer is introduced to the mold. Typical and useful molding polymers include any of the thermoplastic polymers forming viscoelastic fluids upon heating so as to be able to be fabricated to desired shapes in a mold. Thermosetting polymers are also useful viscoelastic molding materials and can be employed provided the thermosetting molding material does not degrade the electrodeposited conductive film due to the higher mold temperatures typically required for forming and curing thermosets.

The viscoelastic molding materials can include plastics which form by curing or cross-linking in the mold cavity such as polyester, epoxy or fiberglass.

Other useful molding polymers include thermoplastics polyalkenes, polyethylene, polypropylene, polyamides such as nylon 6/6, polyimides, polyesters, allyl esters, polyether-ester copolymers, polystyrene such as and including acrylonitrile-butadiene-styrene, styrene block copolymers, polyurethanes, carbonates, acrylates, methacrylates, olefin elastomers, ethylene copolymers, polysulfone, polyalkeneterephthalates, polyalkylalkenes, polyphenylene sulfide, epoxy, and nitrile resins, and thermosets, phenolics, melamines, alkyds, to recite but a few. Polycarbonate molding polymers are preferred. Molding polymers should be selected such that processing conditions do not degrade the conductive film electrodeposited earlier in the mold.

A typical electrochemical polymerization system consists of an electrolytic cell with electrodes, electrolyte, monomer, and solvent. The solvent is generally needed whenever the monomer is not soluble in the electrolyte. When an electric current flows through the system, electrode reactions take place, followed by the polymerization of monomers. In this invention, the electrolytic cell is composed with the surface of the mold cavity as an electrode and another electrode.

Kaneto, K., Yoshino, K., and Inuishi, Y., Japanese J. Applied Physics, 22, No. 7, L 412-14 (1983) report color switching and memory effects are possible by using polythiophene and polypyrrole films in electrooptical devices. It is stated polythiophene in $LiBF_4$/acetonitrile switches red⟵⟶blue in 30-100 milliseconds under reversibly applied voltages of −2.0 to +4.0 versus Li. More than $10^3$ cycles of reproducible color change were observed. Three color states of yellow green, dark brown, and blue were demonstrated for polypyrrole.

By forming such polymers according to the in-mold system of the present invention, the present invention enables practical and commercial utilization of such laboratory effects of these thin films by enabling rapid formation of usable plastic parts having color-switching coatings and/or memory effects.

Applications for this technology include manufacture of catalytic electrodes. When the conductive or semiconductive polymeric film such as pyrrole is electrodeposited, dopants such as iron phthalocyanines can be incorporated electrochemically into polypyrrole during polymerization. The resulting film formed as a surface part of a molded part would have electrocatalytic activity for reduction of oxygen. Ruthenium oxide dopant can be used similarly for photodissociation of $H_2O$.

Application of this technology for forming articles as diverse as battery components, EMI shields, microwave absorbers, electrical circuits, and photoconductors become achievable by appropriate selection of conductive polymer or polymer and dopant to be electrodeposited to yield a desired level of conductivity to the coating on the molded part.

By masking the mold surface and forming the platinum catalytic surface of the mold according to any of the well known techniques in the art, a decorative or functional pattern can be achieved. Thus, conductive polymer can be electrodeposited corresponding to the decorative or functional pattern of the catalytic surface yielding a molded part having a decorative or functional conductive coating.

Where decorative effects are desired, a photochromic or electrochromic polymer could be selected to be electrodeposited. Where functional coatings are desired, a polymer could be selected to be electrodeposited having a customized conductivity level. For certain applications the polymer coating to be electrodeposited on the catalytic surface of the mold can be selected to be of cascading conductivity or can be reversible conductivity i.e., going from conductive to nonconductive in reaction to application of light, voltage or other externally applied force.

EXAMPLE 1

The following conditions are typical of those used to obtain an in-mold polymeric conductive or semi-conductive coated plastic part.

monomer: thiophene
electrolyte: tetraethyl ammonium tetraflouroborate in acetonitrile
catalyst on mold: platinum
current density: 0.1-10 amps/m$^2$
flow velocity: 0-2 m/sec. (between anode and mold surface)
mold temperature: 250° C.
mold type: injection, Battenfield press
molding polymer: polycarbonate A typical film-forming electropolymerizable solution yielding conductive coatings onto a platinum treated mold cavity can be formed using $10^{-2}$M thiophene monomer solution with electrolyte such as 0.1M tetra ammonium tetraflouroborate in acetonitrile. The solution can be bubbled with argon for 5-10 minutes before use. The electrocoating solution is swirled through the mold while a current density of approximately 0.1-10 amps/m$^2$ is applied. The gap between the anode and mold surface measures approximately 10 mm. After approximately 10 minutes the remaining electrocoating solution is purged from the mold cavity. A polycarbonate molding material is injected into the mold pursuant to normal injection cycle for a polycarbonate molding. Following press release, a conductive coated polycarbonate article is obtained which has a conductive polythiophene coating. The cycle can then be repeated.

TABLE 1

| Electrodeposited film application | |
|---|---|
| Application | Polymer Electrodeposited |
| (a) electrochromic | isothionaphthene |
| (b) photochromic | diazo compounds or organic compounds with silver halides |
| (c) conductivity (metallic conductivity) | polyacetylene |
| (d) conductivity (less than metallic conductivity) | Polypyrrole |
| (e) Conductivity (semi-conductive | oxidized forms of any of above |
| (f) reversable conductivity | polyaniline |

While the invention has been described and illustrated with respect to the preferred embodiments, various modifications can be made by those skilled in the art without departing from the spirit and scope of the invention as described. Such modifications are considered to be within the scope of the invention and the appended claims.

We claim:

1. An in-the-mold method for forming molded plastic parts having a conductive coating comprising:
   providing a mold cavity defined by a mold member having a catalytic surface
   connecting the mold member as an electrode to a current source
   electrodepositing a conductive polymer onto the catalytic surface of the mold member to form a conductive film
   introducing into the mold cavity a viscoelastic molding material
   compressing the molding material within the molding cavity so as to achieve greater adherence of the conductive film to the molding material than the adherence of the conductive film to the catalytic surface of the mold member
   solidifying and/or curing the viscoelastic molding material to form a molded part
   releasing the molded part with adhering conductive film from the mold cavity.

2. The process according to claim 1 wherein said conductive polymer is selected from the group consisting of photochromic or electrochromic polymers.

3. The process according to claim 1 wherein said conductive polymer is a semi-conductor.

4. The process according to claim 1 wherein said electrodeposited conductive film is comprised of one or more polymers selected from the group consisting of polythiophene, B-substituted polythiophene, polypyrrole, N-substituted polypyrrole, N-alkyl-polypyrrole, poly(B,B'-dimethylpyrrole)polyacetylene, polyaromatic compounds, and dehydrohalogenated PVC.

5. The process according to claim 4 wherein said film includes a dopant.

6. The process according to claim 5 wherein said dopant is selected from the group consisting of rare earth salts, $LiBF_4$, iron phthalocyanine, As flouride, Ag halides, Sb flouride, $CF_3SO_3^-$, ruthenium oxide, and $C_2H_2$.

7. The process according to claim 1 wherein the electrodeposited conductive film is formed from the polymerization of monomers selected from the group consisting of thiophene, 2,2'-bithiophene, 3-methylthiophene, 3-bromothiophene, 3-thiopheneacetonitrile, 3,4-dibromothiophene, pyrrole, pyrrole doped with $CF_3SO_3^-$, 3-methyl pyrrole, acetylene doped with As or Sb salts, and dehydrohalogenated PVC.

8. The process according to claim 1 wherein said mold is selected from the group consisting of compression, transfer, injection, or injection-compression.

9. The process according to claim 1 wherein the viscoelastic molding material is selected from the group consisting of thermoplastic and thermosetting molding materials.

10. The process according to claim 9 wherein the molding material is selected from the group consisting of polyalkene, polyethylene, polypropylene, polyamide, polyimide, polyester, alkyl ester, polyether-ester copolymer, polystyrene, acetonitrile-butadiene-styrene, allyl ester, polystyrene block copolymer, polyurethane, polycarbonate, polyacrylate, polymethacrylate, polyolefin, nitrile resin, epoxy, polysulfone, polyalkeneterephthalate, polyalkylalkene polyphenylene, phenolic, melamine and alkyd.

* * * * *